(12) United States Patent
Lee et al.

(10) Patent No.: US 11,054,992 B2
(45) Date of Patent: Jul. 6, 2021

(54) MEMORY MODULE AND MEMORY SYSTEM INCLUDING THE MEMORY MODULE

(71) Applicant: SK hynix Inc., Icheon-si (KR)

(72) Inventors: Dong Uk Lee, Icheon-si (KR); Kyung Whan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/272,890

(22) Filed: Feb. 11, 2019

(65) Prior Publication Data

US 2019/0171359 A1 Jun. 6, 2019

Related U.S. Application Data

(63) Continuation of application No. 15/137,170, filed on Apr. 25, 2016, now abandoned.

(30) Foreign Application Priority Data

Dec. 28, 2015 (KR) .................. 10-2015-0187653

(51) Int. Cl.
*G06F 3/06* (2006.01)
(52) U.S. Cl.
CPC ............ *G06F 3/061* (2013.01); *G06F 3/0655* (2013.01); *G06F 3/0673* (2013.01)
(58) Field of Classification Search
CPC ....... G06F 3/061; G06F 3/0655; G06F 3/0673
See application file for complete search history.

(56) References Cited

U.S. PATENT DOCUMENTS

| 6,956,708 | B1 | 10/2005 | Sutardja et al. | |
|---|---|---|---|---|
| 7,437,497 | B2 | 10/2008 | Cornelius | |
| 9,195,602 | B2* | 11/2015 | Hampel | G11C 7/1003 |
| 2004/0105292 | A1* | 6/2004 | Matsui | G11C 7/1048 365/63 |
| 2004/0256638 | A1* | 12/2004 | Perego | G06F 13/1684 257/200 |
| 2008/0025108 | A1‡ | 1/2008 | Rajan | G11C 5/04 365/189.05 |
| 2008/0025122 | A1‡ | 1/2008 | Schakel | G11C 11/406 365/222 |
| 2009/0024790 | A1* | 1/2009 | Rajan | G11C 11/4063 711/105 |

FOREIGN PATENT DOCUMENTS

| CN | 1495896 A | 5/2004 |
|---|---|---|
| CN | 1630855 A | 6/2005 |

(Continued)

*Primary Examiner* — Edward J Dudek, Jr.
(74) *Attorney, Agent, or Firm* — William Park & Associates Ltd.

(57) ABSTRACT

A memory system may include a controller; and a plurality of memory modules, wherein a data input and output of the plurality of memory modules is performed with a single channel manner according to an address signal provided from the controller in common, wherein each of the plurality of memory modules includes a buffer chip and a plurality of memory chips coupled to the buffer chip, wherein all the buffer chips of the plurality of memory modules are directly coupled to the controller through independent input and output bus.

16 Claims, 13 Drawing Sheets

(56) References Cited

FOREIGN PATENT DOCUMENTS

| | | | |
|---|---|---|---|
| CN | 101617242 | A | 12/2009 |
| CN | 102194510 | A | 9/2011 |
| CN | 102467978 | A | 5/2012 |
| CN | 102881324 | A | 1/2013 |
| DE | 102006036823 | A1 | 2/2008 |
| KR | 1020140015169 | A ‡ | 2/2014 |
| KR | 1020140015169 | A | 2/2014 |

\* cited by examiner
‡ imported from a related application

MEMORY MODULE AND MEMORY SYSTEM INCLUDING THE MEMORY MODULE

CROSS-REFERENCES TO RELATED APPLICATION

The present application is a continuation-in-part application of U.S. application Ser. No. 15/137,170, filed on Apr. 25, 2016, and claims priority under 35 U.S.C. § 119(a) to Korean application number 10-2015-0187653, filed on Dec. 28, 2015, which is incorporated herein by reference in its entirety.

BACKGROUND

1. Technical Field

Various embodiments generally relate to a semiconductor integrated circuit, and more particularly, to a memory module and a memory system including the memory module.

2. Related Art

Referring to FIG. 1, a memory system 1 in the related art include a plurality of memory modules 3 and a controller 2 which controls the plurality of memory modules 3.

Each of the plurality of memory modules 3 include a dual in-line memory module (DIMM).

The memory module 3 includes a plurality of memory chips 4, for example, a dynamic random access memory (DRAM) chip, a flash RAM chip, a magnetic RAM (MRAM) chip, and a ferroelectric RAM (FRAM) chip.

The plurality of memory modules 3 and the controller 2 are coupled through input/output (I/O) buses 5.

In the memory system 1 in the related art, the number of memory modules 3 may be increased to increase the memory density, but speed limits, degradation in operation performance, and the like may be caused due to a multi drop bus structure, that is, a structure that the I/O buses 5 are commonly coupled to memory chips 4 in a vertical direction.

Capacitance increase and the like according to the common connection of the I/O buses 5 to the memory chips 4 in the vertical direction may be caused and thus the operation speed and operation performance may be degraded.

SUMMARY

According to an embodiment, there may be provided a memory system. The memory system may include a controller; and a plurality of memory modules, wherein a data input and output of the plurality of memory modules is performed with a single channel manner according to an address signal provided from the controller in common, wherein each of the plurality of memory modules includes a buffer chip and a plurality of memory chips coupled to the buffer chip, wherein all the buffer chips of the plurality of memory modules are directly coupled to the controller through independent input and output bus.

According to an embodiment, there may be provided a memory system. The memory system may include a controller; and a plurality of memory modules, wherein a data input and output of the plurality of memory modules is performed with a single channel manner according to an address signal provided from the controller in common, wherein each of the plurality of memory modules includes a buffer chip and a plurality of memory chips coupled to the buffer chip, wherein memory chips in a column direction among the plurality of memory chips in the plurality of memory modules are divided into ranks in single column units or in plural column units, wherein all the buffer chips of the plurality of memory modules are directly coupled to the controller through independent input and output bus.

DETAILED DESCRIPTION

Figure 1:
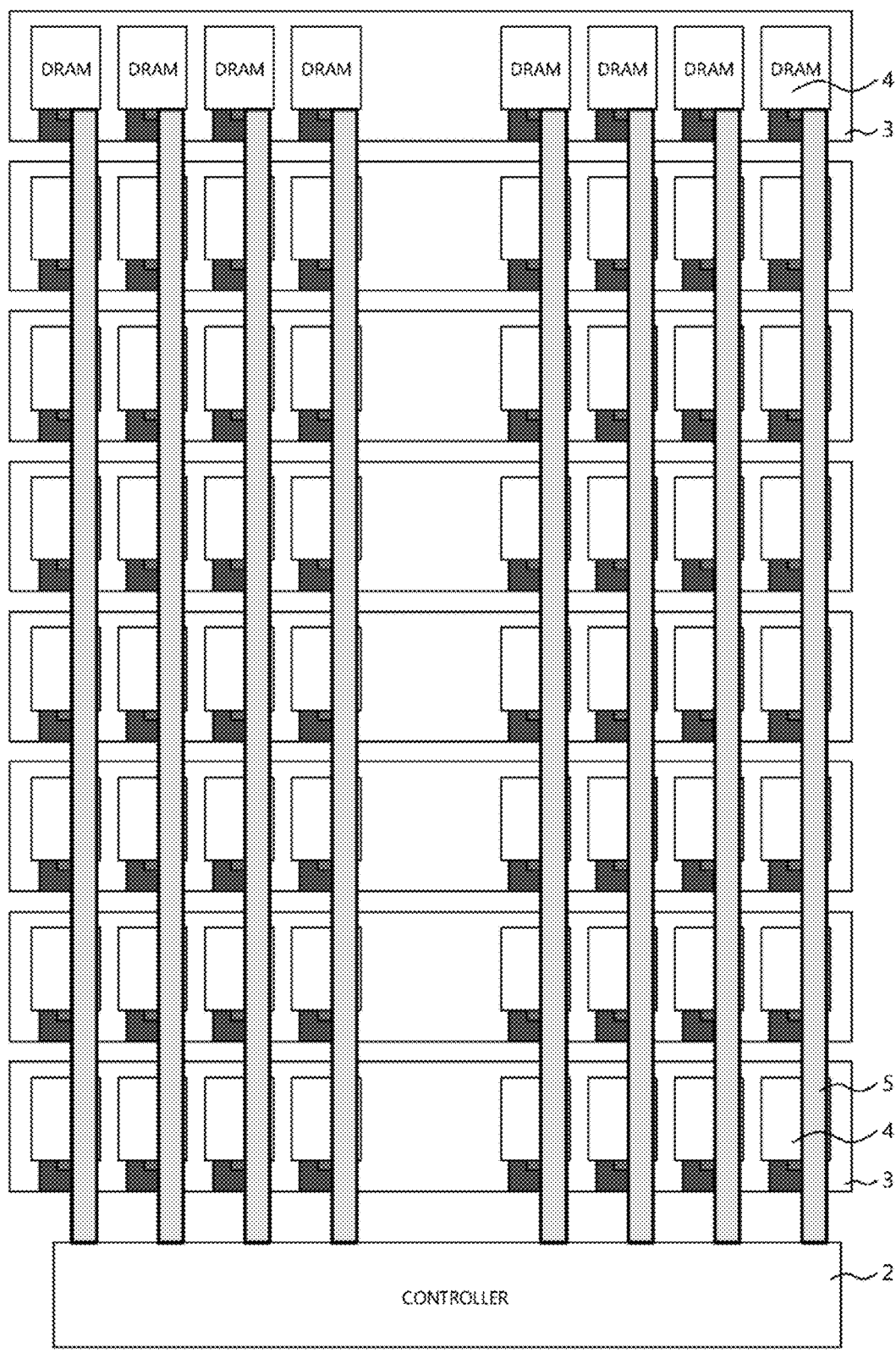
FIG. 1 is a view illustrating a configuration of a memory system in the related art.

One or more exemplary embodiments may provide for a memory module capable of improving the integration degree and operation speed and a memory system including the same.

Hereinafter, examples of embodiments will be described with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, examples of embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts are described herein with reference to cross-section and/or plan illustrations that are schematic illustrations of embodiments. However, embodiments should not be limited construed as limited. Although a few embodiments will be illustrated and described, it will be appreciated by those of ordinary skill in the art that changes may be made in these examples of the embodiments without departing from the principles and spirit of the disclosure.

Figure 2:
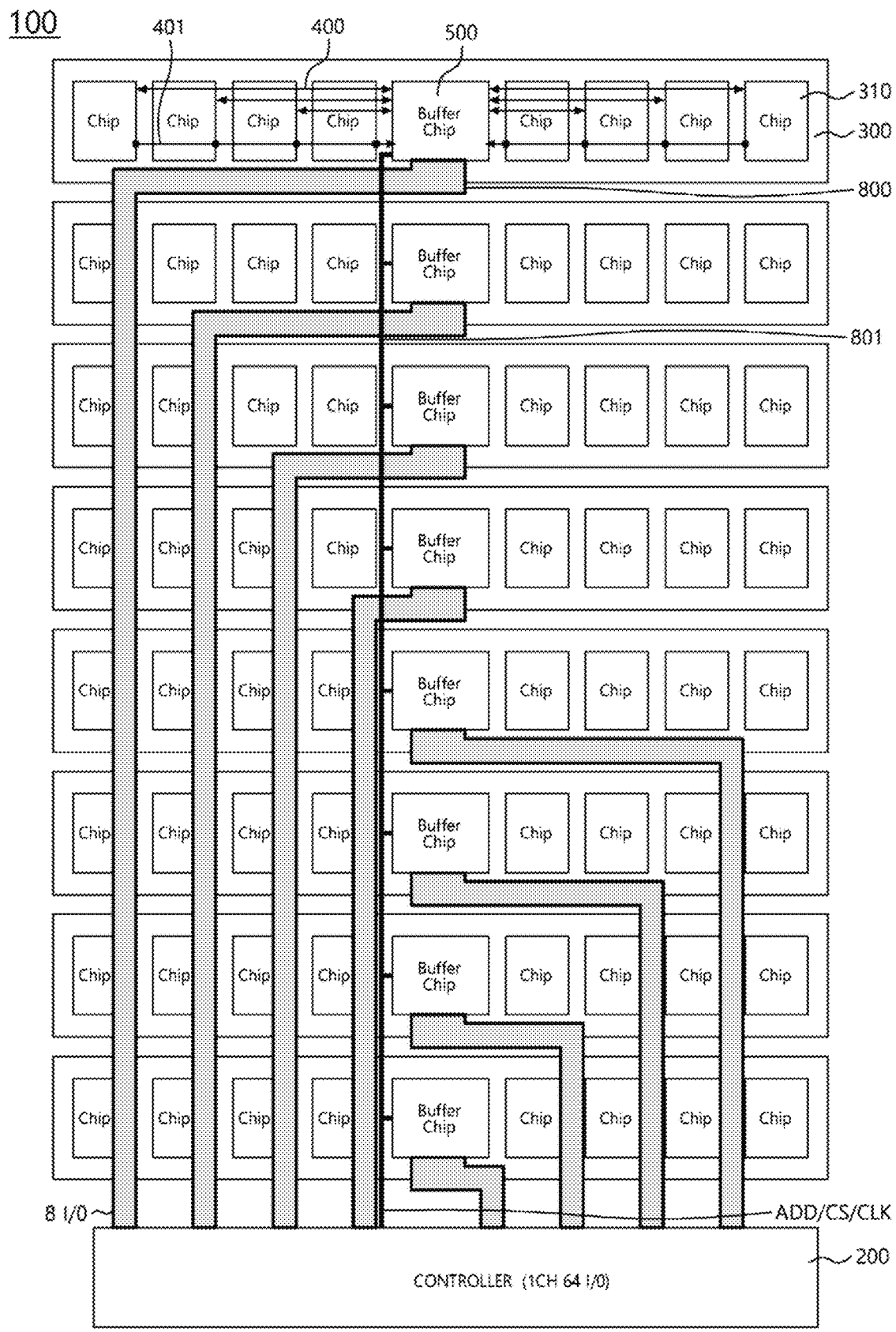
FIG. 2 is a view illustrating a representation of an example of a configuration of a memory system according to an embodiment.
Figure 3:
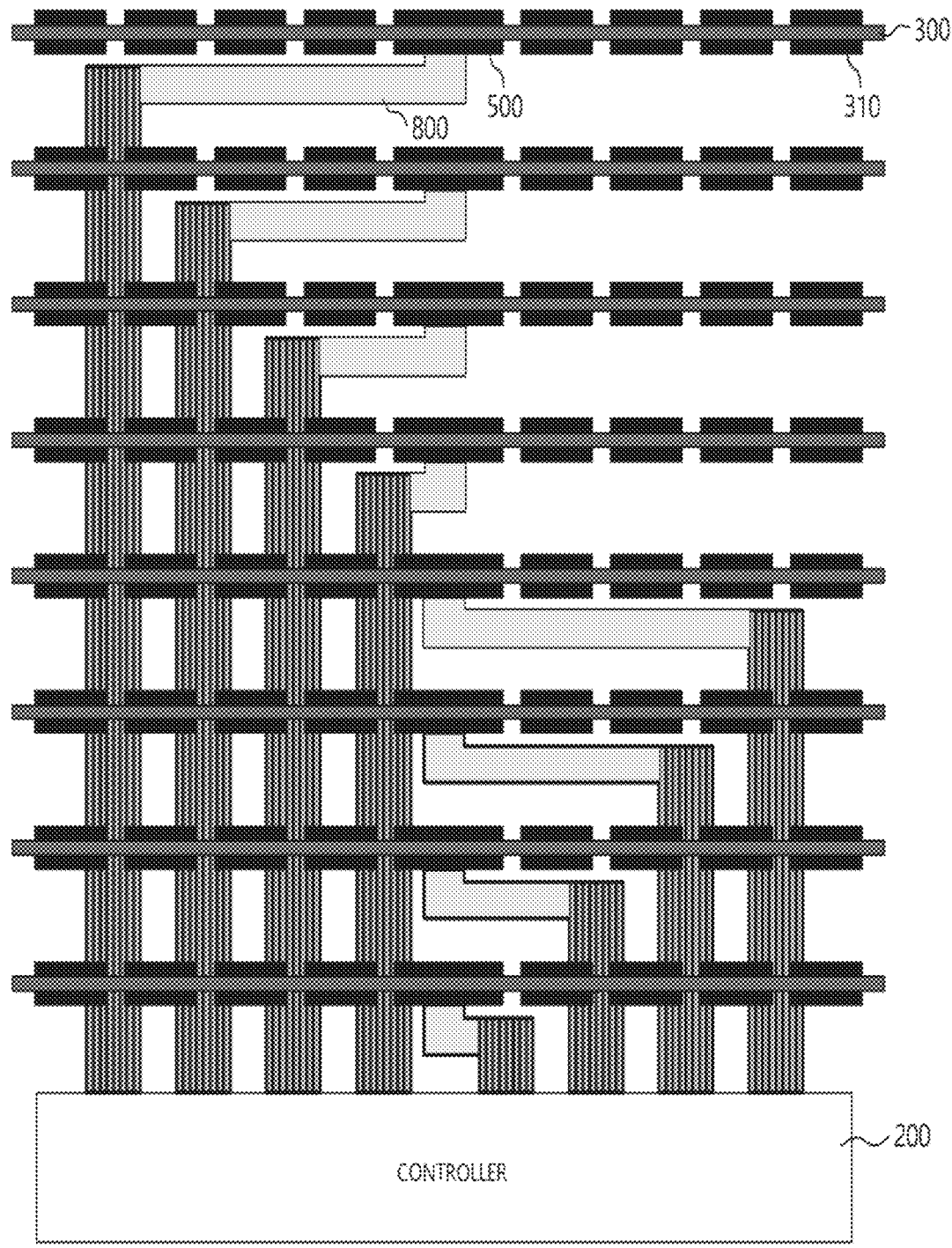
FIG. 3 is a plan view illustrating a representation of an example of the memory system of FIG. 2.

Referring to FIGS. 2 and 3, a memory system 100 according to an embodiment may include a controller 200 and a plurality of memory modules 300.

The memory system 100 according to an embodiment may be configured to operate all memory chips 310 of a plurality of memory modules 300 as a single channel (1 CH) manner.

Each of the plurality of memory modules 300 may include a buffer chip 500 and a plurality of memory chips 310 arranged in a row direction.

The buffer chip 500 in each of the plurality of memory modules 300 may be directly coupled to the controller 200 not through other memory modules 300 but through a corresponding one among data input and output buses (Hereinafter, I/O buses) 800, respectively.

Data input and output of the controller 200 between the buffer chips 500 may be performed through the I/O buses 800.

The buffer chips 500 of the plurality of memory modules 300 are coupled to the controller 200 in common through a command bus 801.

The controller 200 may provide commands and a clock signal CLK to the buffer chips 500 in common through the command bus 801.

The commands may comprise address signal ADD and chip selection signal CS.

The plurality of memory chips 310 may be coupled to the buffer chip 500 through independent input/output (I/O) lines 400, respectively.

The buffer chip 500 may be configured to control a data I/O operation between the plurality of memory chips 310 and the controller 200.

The memory chips 310 are coupled to the buffer chip 500 in common through command line 401.

The buffer chip 500 may provide the address signal ADD, chip selection signal CS and clock signal CLK, received through the command bus 801, to the memory chips 310 in common through the command line 401.

Figure 4:
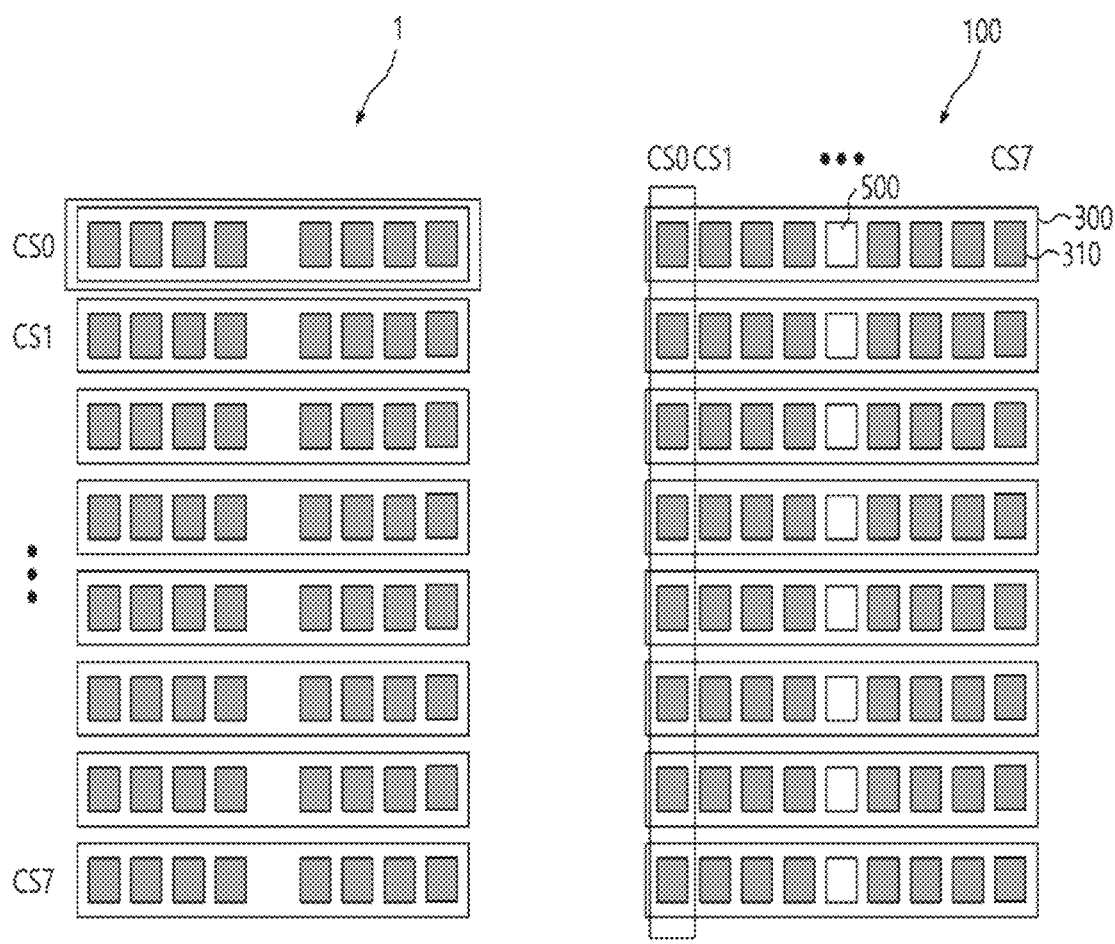
FIG. 4 is a view illustrating a representation of an example of a memory chip selection method of a memory system according to an exemplary embodiment.

Referring to FIGS. 4 and 2, the memory system 100 according to an embodiment may select a rank using a select signal CS, and perform read/write operations on the selected rank.

In the memory system 1 in the related art illustrated in the left side of FIG. 4, the memory modules may be divided into ranks different from each other and the ranks may be selected using chip selection signals CS0 to CS7.

In the memory system 100 according to an embodiment illustrated in the right side of FIG. 4, the memory modules may not be divided into the ranks, but memory chips of different memory modules, which are located in column units, that is, on the same lines (for example, vertical direction), may be divided into the ranks, and the ranks may be selected through the chip selection signals CS0 to CS7.

The memory system 100 according to an embodiment may select memory chips from the memory modules one by one using the selection signals CS0 to CS7, and FIG. 4 illustrates an example whereby the memory chips in column units are selected as the rank.

The buffer chip 500 may control the data I/O operation between the plurality of memory chips 310 and the controller 200 using the chip selection signals CS0 to CS7.

The buffer chip 500 according to an embodiment may employ an 8:1 multiplexing/demultiplexing circuit configuration to control the data I/O between a plurality of memory chips 310 (that is, 8 memory chips 310) and the controller 200 (see FIG. 2).

The buffer chip 500 may be arranged in the center of the memory module 300 to minimize degradation in signal transmission efficiency due to a physical distance difference of each memory chip 310.

Figure 5:
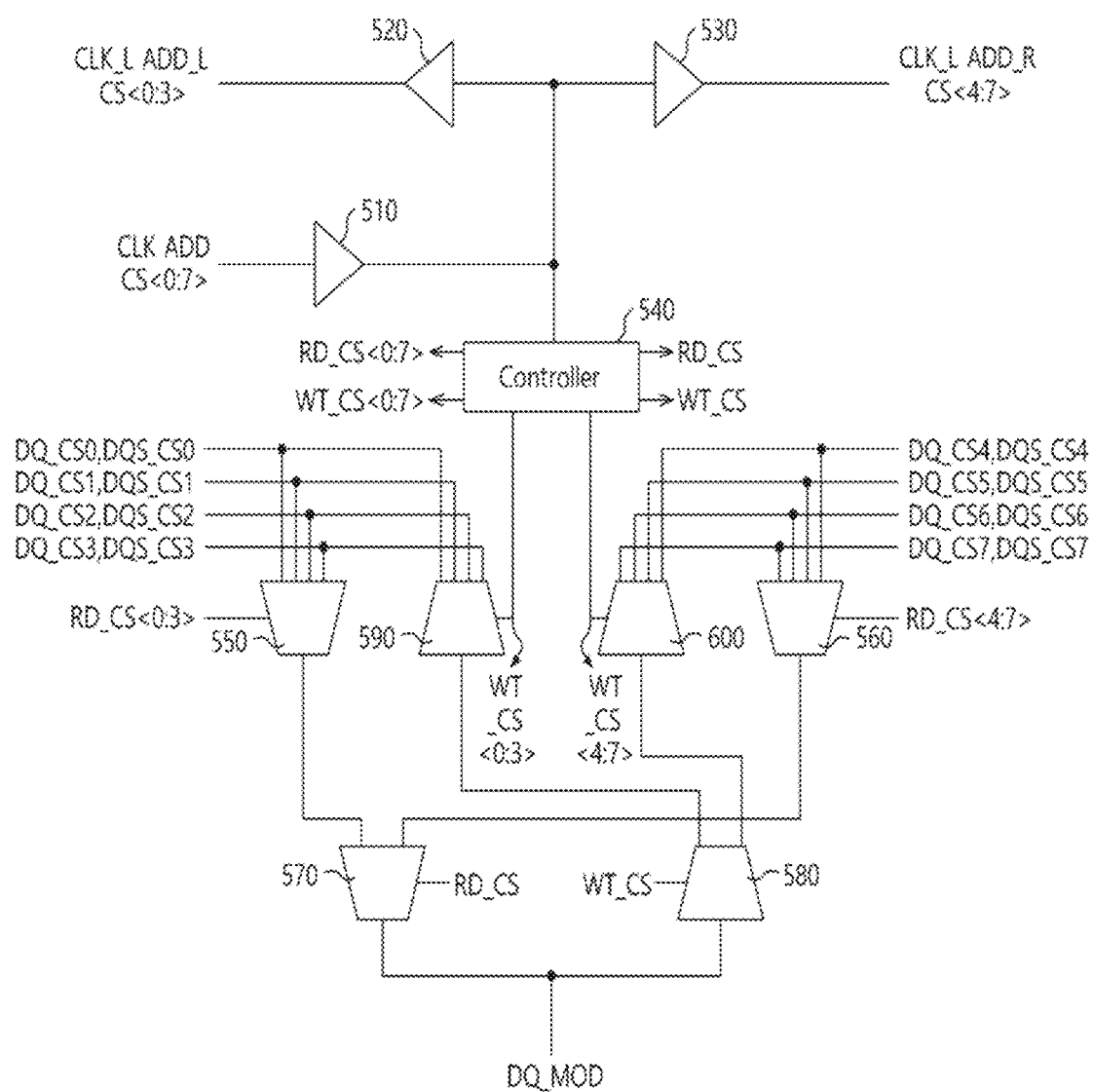
FIG. 5 is a view illustrating a representation of an example of a configuration of a buffer chip of FIG. 2.

Referring to FIG. 5, the buffer chip 500 may include first to third drivers 510 to 530, a controller 540, read multiplexing circuits 550 and 560, write multiplexing circuits 590 and 600, and first and second switches 570 and 580.

The first driver 510 may transfer a clock signal CLK, an address signal ADD, and the chip selection signal CS<0:7> provided from the controller 200 to the buffer chip 500.

The second driver 520 and the third driver 530 may distribute the clock signal CLK, the address signal ADD, and the chip selection signal CS<07> to the memory chips 310 in the left and right sides on the basis of the buffer chip 500.

The second driver 520 may receive an output of the first driver 510 and output a clock signal CLK_L, an address signal ADD_L, and chip selection signals CS<0:3> for the memory chips 310 on the left side of the buffer chip 500.

The third driver 530 may receive the output of the first driver 510 and output a clock signal CLK_R, an address signal ADD_R, and chip selection signals CS<4:7> for the memory chips on the right side of the buffer chip 500.

The controller 540 may generate control signals RD_CS<0:3>, RD_CS<4:7>, WT_CS<0:3>, WT_CS<4:7>, RD_CS, WT_CS, and DQS_MOD which control the data I/O of the plurality of memory chips 310 and the controller 200 according to the clock signal CLK, the address signal ADD, and the chip selection signals CS<0:7>.

The controller 540 may divide the read/write operations using the address signal ADD and generate the control signal RD_CS which defines the read operation and the control signal WT_CS which defines the write operation.

The controller 540 may generate the control signals RD_CS<0:3> and RD_CS<4:7> which define memory chips corresponding to a rank currently selected according to the read operation among the memory chips 310 using the address signal ADD and the chip selection signals CS<0:7>.

The controller 540 may generate the control signals WT_CS<0:3> and WT_CS<4:7> which define memory chips corresponding to a rank currently selected according to the write operation among the memory chips 310 using the address signal ADD and the chip selection signals CS<0:7>.

The read multiplexing circuits 550 and 560 may selectively output data DQ_CS0, DQ_CS1, DQ_CS2, and DQ_CS3 and DQ_CS4, DQ_CS5, DQ_CS6, and DQ_CS7 according to strobe signals DQS_CS0, DQS_CS1, DQS_CS2, and DQS_CS3 and DQS_CS4, DQS_CS5, DQS_CS6, and DQS_CS7 in response to the control signal RD_CS<0:7>.

The read multiplexing circuits 550 and 560 may include a first read multiplexing circuit 550 and a second read multiplexing circuit 560.

The write multiplexing circuits 590 and 600 may transfer an output of the second switch 580 as one among the data DQ_CS0, DQ_CS1, DQ_CS2, and DQ_CS3 and DQ_CS4, DQ_CS5, DQ_CS6, and DQ_CS7 to a corresponding memory chip 310 in response to the control signal WT_CS<0:7>.

The write multiplexing circuits 590 and 600 may include a first write multiplexing circuit 590 and a second write multiplexing circuit 600.

Since the buffer memory chip 500 is arranged in the center of the memory module 300, the first read multiplexing circuit 550 and the first write multiplexing circuit 590 corresponding to the chip selection signals CS<0:3> may be arranged in the left side of the buffer chip 500, and the second read multiplexing circuit 560 and the second write multiplexing circuit 600 corresponding to the chip selection signals CS<4:7> may be arranged in the right side of the buffer chip 500.

The first read multiplexing circuit 550 may selectively output the data DQ_CS0, DQ_CS1, DQ_CS2, and DQ_CS3 according to the strobe signals DQS_CS0, DQS_CS1, DQS_CS2, and DQS_CS3 in response to the control signal RD_CS<0:3>.

Referring to FIG. 4, the data DQ_CS0, DQ_CS1, DQ_CS2, and DQ_CS3 and the strobe signals DQS_CS0, DQS_CS1, DQS_CS2, and DQS_CS3 may be output from the memory chips 310 on the left side of the buffer chip 500 according to the chip selection signals CS<0:3>.

For example, when a chip selection signal CS0 of the chip selection signals CS0, CS1, CS2, and CS3 is activated, the data DQ_CS0 and the strobe signal DQS_CS0 may be output from the leftmost memory chip 310 to the buffer chip 500.

The second read multiplexing circuit 560 may selectively output the data DQ_CS4, DQ_CS5, DQ_CS6, and DQ_CS7 according to the strobe signals DQS_CS4, DQS_CS5, DQS_CS6, and DQS_CS7 in response to the control signal RD_CS<4:7>.

Referring to FIG. 4, the data DQ_CS4, DQ_CS5, DQ_CS6, and DQ_CS7 and the strobe signals DQS_CS4, DQS_CS5, DQ5_CS6, and DQS_CS7 may be output from the memory chips 310 on the right side of the buffer chip 500 according to the chip selection signals CS<4:7>.

For example, when the chip selection signal CS7 of the chip selection signals CS4, CS5, CS6, and CS7 is activated, the data DQ_CS7 and the strobe signal DQS_CS7 may be output from the rightmost memory chip 310 to the buffer chip 500.

When the control signal RD_CS is activated, the first switch 570 may transfer an output of the first read multiplexing circuit 550 or the second read multiplexing circuit 560 as data DQ_MOD to the controller 200 through the I/O bus 800 (See FIG. 2).

When the control signal WT_CS is activated, the second switch 580 may transfer the data DQ_MOD provided from the controller 200 through the I/O bus 800 to the first write multiplexing circuit 590 or the second write multiplexing circuit 600.

The first write multiplexing circuit 590 may transfer an output of the second switch 580 as one of data DQ_CS0, DQ_CS1, DQ_CS2, and DQ_CS3 to a corresponding memory chip 310 in response to the control signal WT_CS<0:3>.

For example, when the chip selection signal CS0 of the chip selection signals CS0, CS1, CS2, and CS3 is activated, an output of the second switch 580 as DQ_CS0 may be transferred to the leftmost memory chip 310 to the buffer chip 500 through the respective I/O line 400 (See FIG. 2).

The second write multiplexing circuit 600 may transfer the output of the second switch 580 as one of data DQ_CS4, DQ_CS5, DQ_CS6, and DQ_CS7 to a corresponding memory chip 310 in response to the control signal WT_CS<4:7>.

Figure 6:
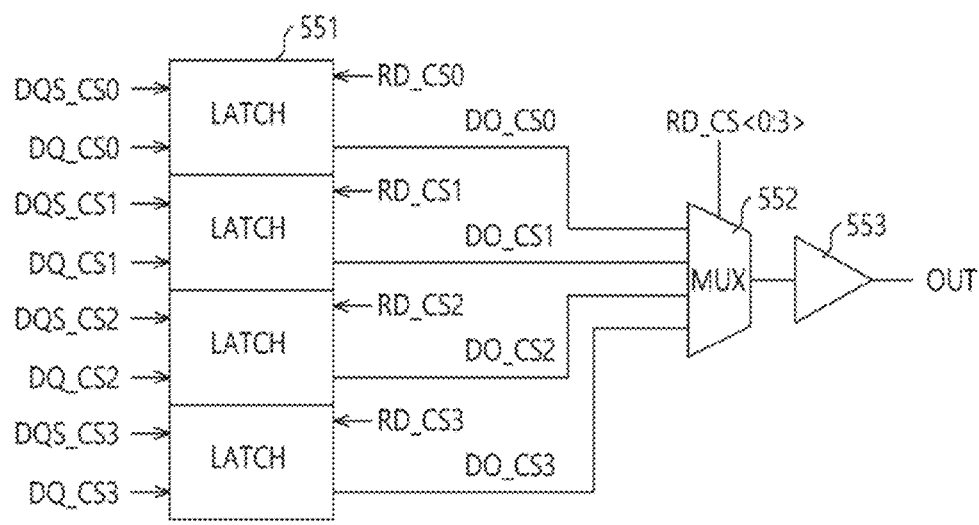
FIG. 6 is a view illustrating a representation of an example of a configuration of a first read multiplexing circuit of FIG. 4.

Referring to FIG. 6, the first read multiplexing circuit 550 may include a plurality of latches 551, a multiplexer 552, and a driver 553.

When the control signal RD_CS<0:3> is activated, the plurality of latches 551 may generate latch signals DO_CS0, DO_CS1, DO_CS2, and DO_CS3 by latching the data DQ_CS0, DQ_CS1, DQ_CS2, and DQ_CS3 according to the strobe signals DQS_CS0, DQS_CS1, DQS_CS2, and DQS_CS3.

The multiplexer 552 may selectively output the latch signals DO_CS0, DO_CS1, DO_CS2, and DO_CS3 of the plurality of latches 551 according to the control signal RD_CS<0:3>.

The driver 553 may output an output of the multiplexer 552, as an output signal OUT, by driving the output of the multiplexer 552.

The second read multiplexing circuit 560 may have substantially the same configuration as that of the first read multiplexing circuit 550 of FIG. 6 except input and output signals thereof. Accordingly, descriptions of the second read multiplexing circuit 560 will be omitted hereinafter to avoid duplicate explanation.

Figure 7:
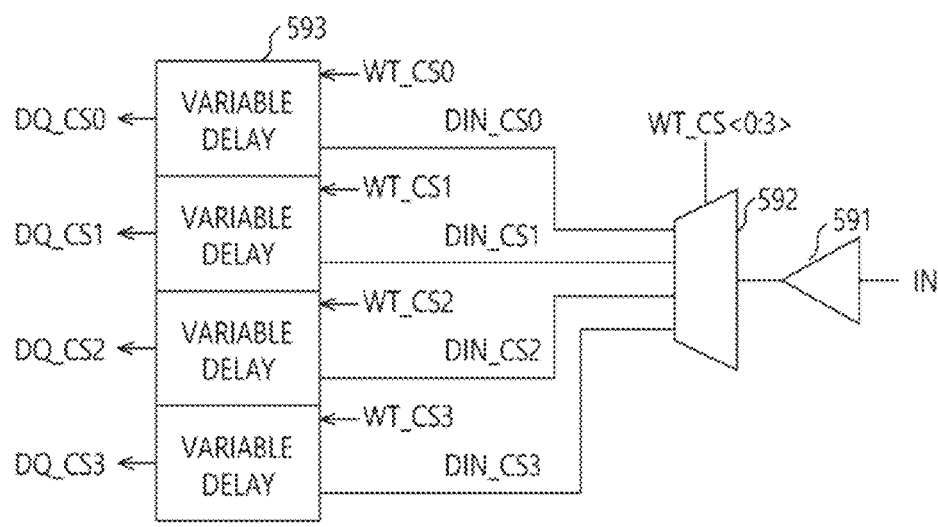
FIG. 7 is a view illustrating a representation of an example of a configuration of a first write multiplexing circuit of FIG. 4.

Referring to FIG. 7, the first write multiplexing circuit 590 may include a driver 591, a multiplexer 592, and a plurality of variable delays 593.

The driver 591 may receive an output signal IN of the second switch 580 by driving the output signal IN of the second switch 580 and then outputting the driven output signal IN.

The multiplexer 592 may selectively output an output signal of the driver 591 as output signals DIN_CS0, DIN_CS1, DIN_CS2, and DIN_CS3 according to the control signal WT_CS<0:3>.

The plurality of variable delays 593 may delay the output signals DIN_CS0, DIN_CS1, DIN_CS2, and DIN_CS3 output from the multiplexer 592 by a preset time and output the delayed signals as the data DQ_CS0, DQ_CS1, DQ_CS2, and DQ_CS3 according to the control signals WT_CS0, WT_CS1, WT_CS2, and WT_CS 3.

Since physical distances between the memory chips 110 and the buffer chip 500 are different, times for transmitting the data DQ_CS0, DQ_CS1, DQ_CS2, and DQ_CS3 to corresponding memory chips 310 may also be different from each other.

Accordingly, in an embodiment, the delay times of the plurality of variable delays 593 may be differently set in such a manner that the times for transmitting the data DQ_CS0, DQ_CS1, DQ_CS2, and DQ_CS3 to corresponding memory chips 310 substantially match with each other.

The second write multiplexing circuit 600 may have substantially the same configuration as that of the first write multiplexing circuit 590 of FIG. 7 except input and output signals thereof. Accordingly, descriptions of the second write multiplexing circuit 600 will be omitted hereinafter to avoid duplicate explanation.

A read operation of the memory system 100 according to an embodiment will be described below with reference to FIG. 8.

An example of a continuous read operation using a read command Read and the chip selection signals CS0 and CS1 being performed will be used as an example.

Referring to FIG. 2, the read command Read and the chip selection signals CS0 and CS1 may be provided to the buffer chips 500 in the plurality of memory modules 300 from the controller 200 through the I/O buses 800.

When the read command Read is input in a state that the chip selection signal CS0 is activated, data output from a rank corresponding to the selected signal CS0 may be performed after a read latency Read Latency.

That is, referring to in FIG. 4, the data DQ_CS0 may be output from the leftmost memory chips 310 corresponding to the chip selection signal CS0 among the memory chips 310 in the plurality of memory modules 300 according to the strobe signal DQS_CS0.

After a preset timing margin tDQSCK from a point of time when the output of data DQ_CS0 is terminated, data output in a rank corresponding to the chip selection signal CS1 may be performed according to a second read command Read.

That is, referring to FIG. 4, data DQ_CS1 may be output from the second to leftmost chips 310 corresponding to the chip selection signal CS1 among the memory chips 310 in the plurality of memory modules 300 according to the strobe signal DQS_CS1.

After a buffer latency Buffer Latency from a point of time when the data DQ_CS0 is output, the buffer chips 500 may sequentially output data DQ_CS0 and DQ_CS1 as the data DQ_MOD according to a buffer strobe signal DQS_MOD.

The buffer latency may refer to a time for multiplexing the data DQ_CS0 and DQ_CS1 output from the memory chips 310 through the buffer chip 500.

The buffer strobe signal DQS_MOD may be a signal in which the strobe signals DQS_CS0 and DQS_CS1 are delayed according to the buffer latency.

Figure 9:
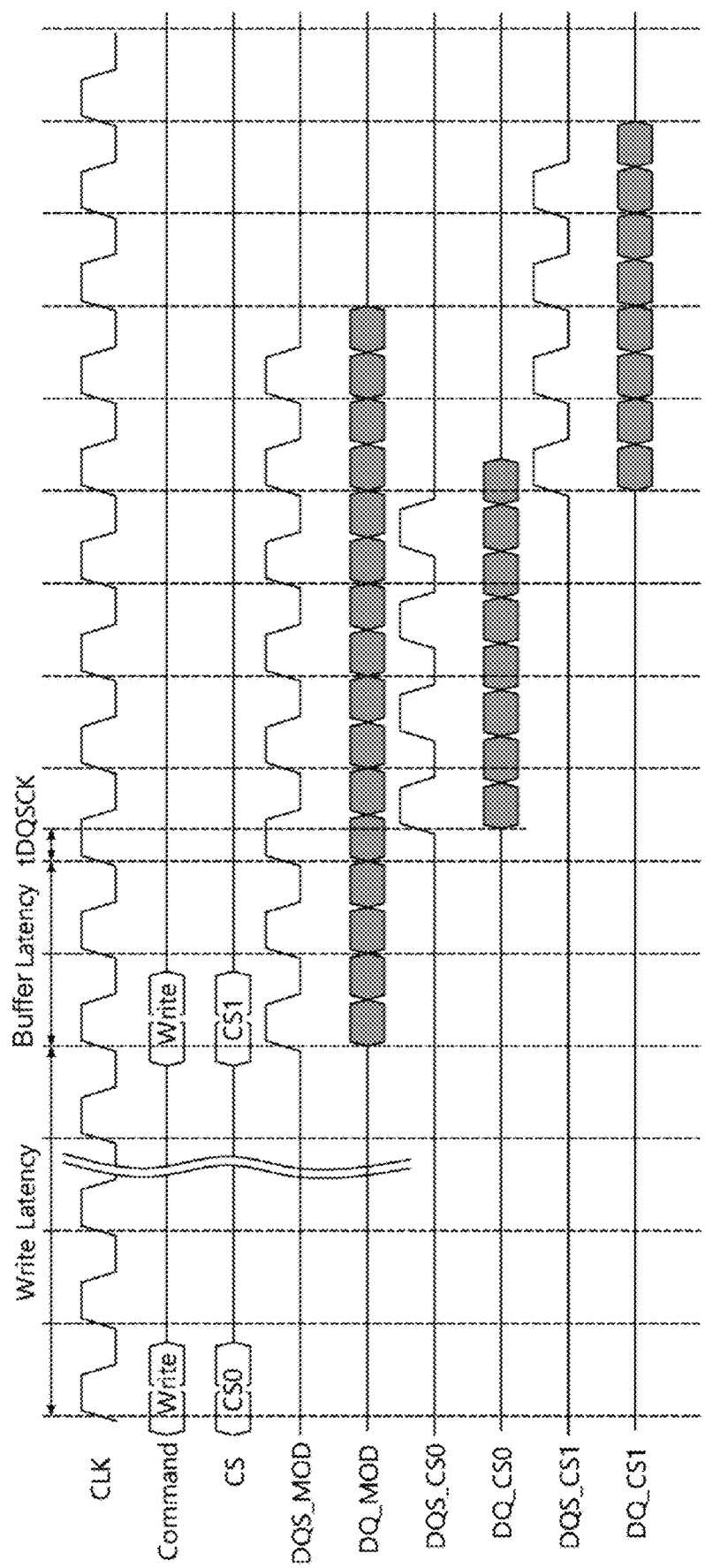
FIG. 9 is an illustration of a representation of an example of write operation timing diagram of a memory system according to an embodiment.

A write operation of the memory system 100 according to an embodiment will be described below with reference to FIG. 9.

An example of a continuous write operation using a write command Write and the chip selection signals CS0 and CS1 being performed will be used as an example.

Referring to FIG. 2, the write command Write the chip selection signals CS0 and CS1, and the data DQ_MOD may be provided to the buffer chips 500 of the plurality of memory modules 300 from the controller 200 through the I/O buses 800.

When the write command Write is input in a state that the chip selection signal CS0 is activated, the data DQ_MOD corresponding to the selected signals CS0 and CS1 may be input from the controller 200 together with the buffer strobe signal DQS_MOD after a write latency Write Latency.

After the buffer latency Buffer Latency and the preset timing margin tDQSCK, the buffer chips 500 may sequentially input the data DQ_CS0 and DQ_CS1 to ranks corresponding to the chip selection signals CS0 and CS1 together with the strobe signals DQS_CS0 and DQS_CS1.

The buffer latency may refer to a time for multiplexing the data DQ_MOD provided from the controller 200 as the data DQ_CS0 and DQ_CS1 through the buffer chip 500.

That is, referring to FIG. 4, the data DQ_CS0 may be stored in the second chips 310 to the leftmost chips corresponding to the chip selection signal CS0 among the memory chips 310 in the plurality of memory modules 300 and subsequently, the data DQ_CS1 may be stored in the second to leftmost chips 310 corresponding to the chip selection signal CS1 among the memory chips 310 in the plurality of memory modules 300.

Figure 10:
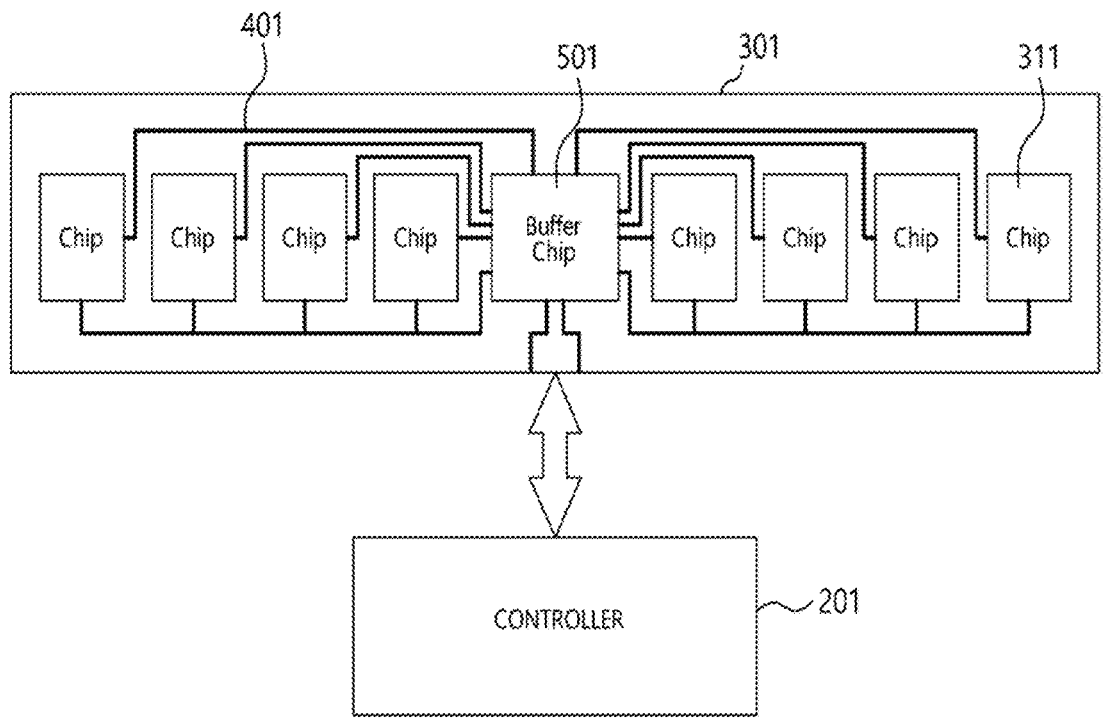
FIG. 10 is a view illustrating a representation of an example of a configuration of a memory system according to an embodiment.

Referring to FIG. 10, a memory system 101 according to an embodiment may include a controller 201 and a plurality of memory modules 301.

The memory system 101 according to an embodiment may perform the data I/O operation in the X16 manner in such a manner that two memory chips from chips 311 are selected for every memory module 301 by dividing the memory chips in a column direction into ranks creating plural column units.

A buffer chip 501 may perform the data I/O operation in the X8 manner by serializing parallel data of two memory chips 311 through a pipe latch and thus the operation speed of the memory module 301 may be improved.

That is, the buffer chip 510 may be operated at speed corresponding to multiple times (for example, twice) the operation speed of the memory chip 311. The speed improvement may be accomplished by serializing the parallel data of two memory chips 311 through the pipe latch as described above.

FIG. 10 illustrates, only, any one of the plurality of memory modules 301.

Each of the plurality of memory modules 301 may include the plurality of memory chips 311 and the buffer chip 501.

The buffer chip 501 may be configured to control the data I/O operations of the plurality of memory chips 311 and the controller 201.

The buffer chip 501 in each of the plurality of memory modules 301 may be directly coupled to the controller 201 not through memory modules 301 but through I/O buses, and the method described in FIG. 3 may be applied thereto.

The plurality of memory chips 311 may be coupled to the buffer chip 501 through independent I/O lines 401, respectively.

The selecting of two memory chips 311 in one memory module 301 may be accomplished in such a manner that two different memory chips 311 share the same chip selection signal CS.

FIG. 10 illustrates a configuration example whereby two different memory chips 311 are selected from among 8 memory chips 311 in each memory module 301 by the chip selection signals CS<0:3>.

For example, when the chip selection signal CS0 is activated, two memory chips 311 may be selected from the memory modules 301.

Figure 11:
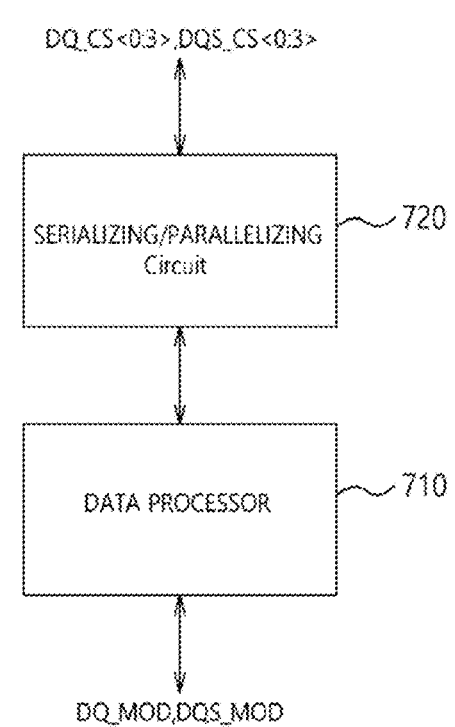
FIG. 11 is a view illustrating a representation of an example of a configuration of a buffer chip of FIG. 10.

Referring to FIG. 11, the buffer chip 501 may include a data processor 710 and a serializing/parallelizing circuit 720.

The serializing/parallelizing circuit 720 may perform serialization and parallelization on I/O signals DQ_CS<0:3> and DQS_CS<0:3> of the plurality of memory chips 311 and I/O signals of the data processor 710.

The serializing/parallelizing circuit 720 may include a serializing/parallelizing logic and a pipe latch.

The data processor 710 may control signal I/O of the plurality of memory chips 311 and the controller 201 according to the clock signal CLK, the address signal ADD, and the chip selection signals CS<0:7> through the serializing/parallelizing (serializing and parallelizing) circuit 720.

The data processor 710 may perform multiplexing on the I/O signals of the serializing/parallelizing circuit 720 and I/O signals DQ_MOD and DQS_MOD of the controller 201 according to the chip selection signals CS<0:7>.

The data processor 710 may have the same configuration as that of the buffer chip 500 of FIG. 5.

A read operation of the memory system 101 according to an embodiment will be described below with reference to FIG. 12.

An example of a sequential read operation using a read command Read and chip selection signals CS0 and CS1 being performed will be used as an example.

The read command Read and the chip selection signals CS0 and CS1 may be provided to the buffer chips 501 in the plurality of memory modules 301 from the controller 201.

When the read command Read is input in a state that the chip selection signal CS0 is activated, data output in a rank corresponding to the chip selection signal CS0 may be performed after a read latency Read Latency.

That is, referring to FIG. 10, data DQ_CS0_A and DQ_CS0_B may be output from two memory chips CS0_A and CS0_B corresponding to the chip selection signal CS0 among the memory chips 311 in the plurality of memory modules 301 according to strobe signals DQS_CS0_A and DQS_CS0_B.

After a preset timing margin tDQSCK from a point of time when the output of data DQ_CS0_A is terminated, data DQ_CS1_A and DQ_CS1_B may be output from two memory chips CS1_A and CS1_B corresponding to the chip selection signal CS1 based on strobe signals DQS_CS1_A and DQS_CS1_B according to a second read command Read.

After a buffer latency from a point of time when the data DQ_CS0_A is output, the buffer chips 501 may sequentially output data DQ_CS0_A and DQ_CS0_B, and DQ_CS1_A, and DQ_CS1_B as data DQ_MOD according to a buffer strobe signal DQS_MOD.

The buffer strobe signal DQS_MOD may refer to a signal in which the strobe signals DQS_CS0_A, DQS_CS0_B, DQS_CS1_A, and DQS_CS1_B are delayed according to the buffer latency, and may have frequency two times greater than those of the strobe signals DQS_CS0_A, DQS_CS0_B, DQS_CS1_A, and DQS_CS1_B.

As described above, the memory system 101 according to an embodiment may increase the operation speed of the memory module 301 two times greater than the method of selecting memory chip 311 one by one from one memory module 301 by selecting two memory chips 311 from one memory module 301 and serializing the parallel data of the two memory chips 311 through a pipe latch in the buffer chip 501.

Figure 13:
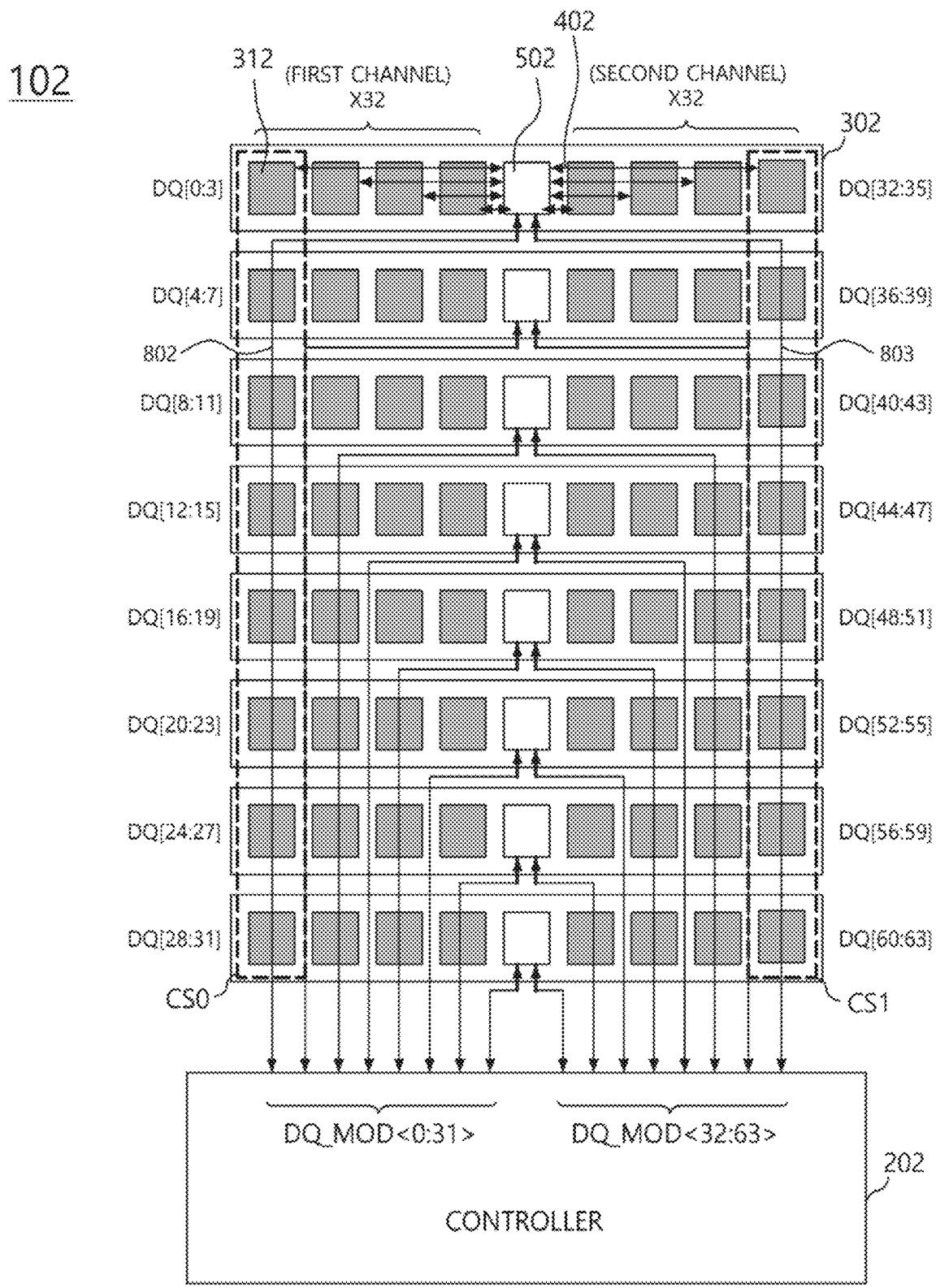
FIG. 13 is a view illustrating a representation of an example of a configuration of a memory system according to an embodiment.

Referring to FIG. 13, a memory system 102 according to an embodiment may include a controller 202 and a plurality of memory modules 302.

Each of the plurality of memory modules 302 may include a plurality of memory chips 312 and a buffer chip 502.

The plurality of memory chips 312 may be coupled to the buffer chip 502 through independent I/O lines 402, respectively.

The buffer chip 502 may be configured to control data I/O operations of the plurality of memory chips 312 and the controller 202.

The memory system 102 according to an embodiment may operate the plurality of memory chips 312 as two different channels, and FIG. 13 illustrates an example of the buffer chip 502 controlling the memory chips 312 by dividing memory chips 312 in the left side of the buffer chip 502 and memory chips in the right side of the buffer chips 502 on the basis of the buffer chip 502 as two different channels that are different from each other, that is, a first channel and a second channel.

For example, when the data I/O operation of the memory system 102 employs an X64 manner using 64 I/O lines, the data I/O operation of the first channel, that is, the memory chips 312 in the left side on the basis of the buffer chip 502 may be performed in an X32 manner using 32 I/O lines and the data I/O operation of the second channel, that is, the memory chips 312 in the right side on the basis of the buffer chip 502 may be performed in an X32 manner using the rest of the 32 I/O lines.

The buffer chip 502 may have the same configuration as that of the buffer chip 500 of FIG. 5 in each channel, that is, with respect to the first channel and the second channel.

The buffer chip 502 in each channel may be directly coupled to the controller 202 not through other memory modules 302 but through I/O lines 802 for the first channel and I/O lines 803 for the second channel.

For example, when a chip selection signal CS0 is activated together with a read command, the memory chips 312 of the first channel corresponding to the chip selection signal CS0 may output data DQ<0:31>.

When the chip selection signal CS1 is activated together with the read command, the memory chips 312 of the second channel corresponding to the chip selection signal CS1 may output data DQ<32:63>.

The buffer chip 502 may independently output the data DQ<0:31> output from the memory chips 312 of the first channel and the data DQ<32:63> output from the memory chips 312 of the second channel as data DQ_MOD<0:31> and data DQ_MOD<32:63> to the controller 202.

Each of the plurality of memory modules 302 may be divided into the first channel and the second channel capable of controlling data I/O independently from each other. Accordingly, the controller 202 may designate different addresses (for example, row addresses) for the first channel and the second channel, and operate the first channel and the second channel by simultaneously activating the different chip selection signals (for example, CS0 and CS1).

Figure 14:
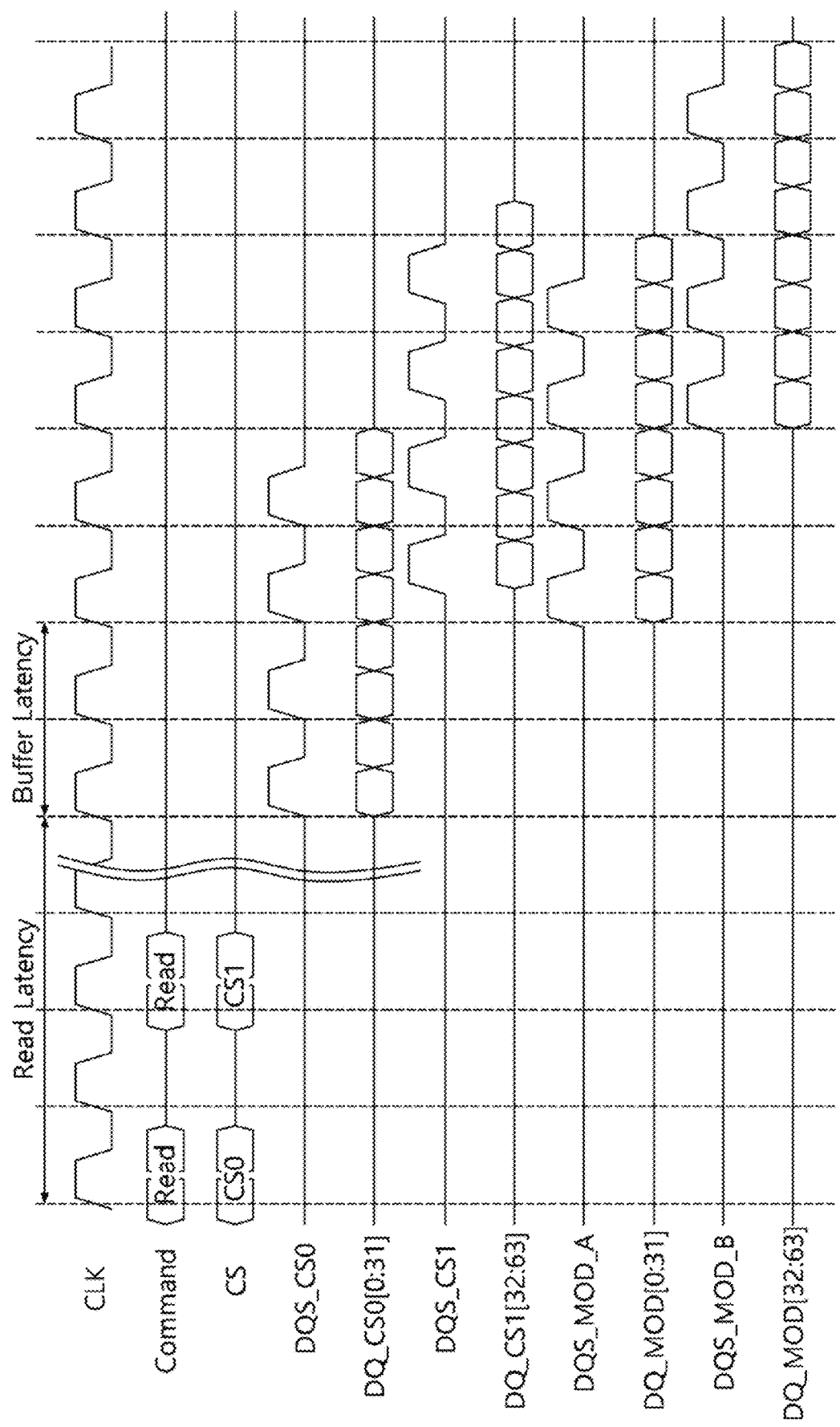
FIG. 14 is an illustration of a representation of an example of read operation timing diagram of a memory system according to an embodiment.

A read operation of the memory system 102 according to an embodiment will be described below with reference to FIG. 14.

An example of a sequential read operation for the first channel and the second channel using a read command Read and the chip selection signals CS0 and CS1 being performed will be used as an example.

The read command Read and the chip selection signals CS0 and CS1 may be provided from the controller 202 to the buffer chips 502 in the plurality of memory modules 302.

When the read command Read is input together with the activated chip selection signal CS0, data output in the first channel corresponding to the chip selection signal CS0 may be performed after a read latency Read Latency.

That is, the data DQ_CS0<0:31> may be output from the memory chips 312 of the first channel on the left side of the buffer chip 502 corresponding to the chip selection signal CS0 according to a strobe signal DQS_CS0.

When the read command Read is input together with the activated chip selection signal CS1, data output in the second channel corresponding to the chip selection signal CS1 may be performed after the read latency.

That is, the data DQ_CS0<32:63> may be output from the memory chips 312 of the second channel on the right side of the buffer chip 502 corresponding to the chip selection signal CS1 according to a strobe signal DQS_CS1.

Figure 8:
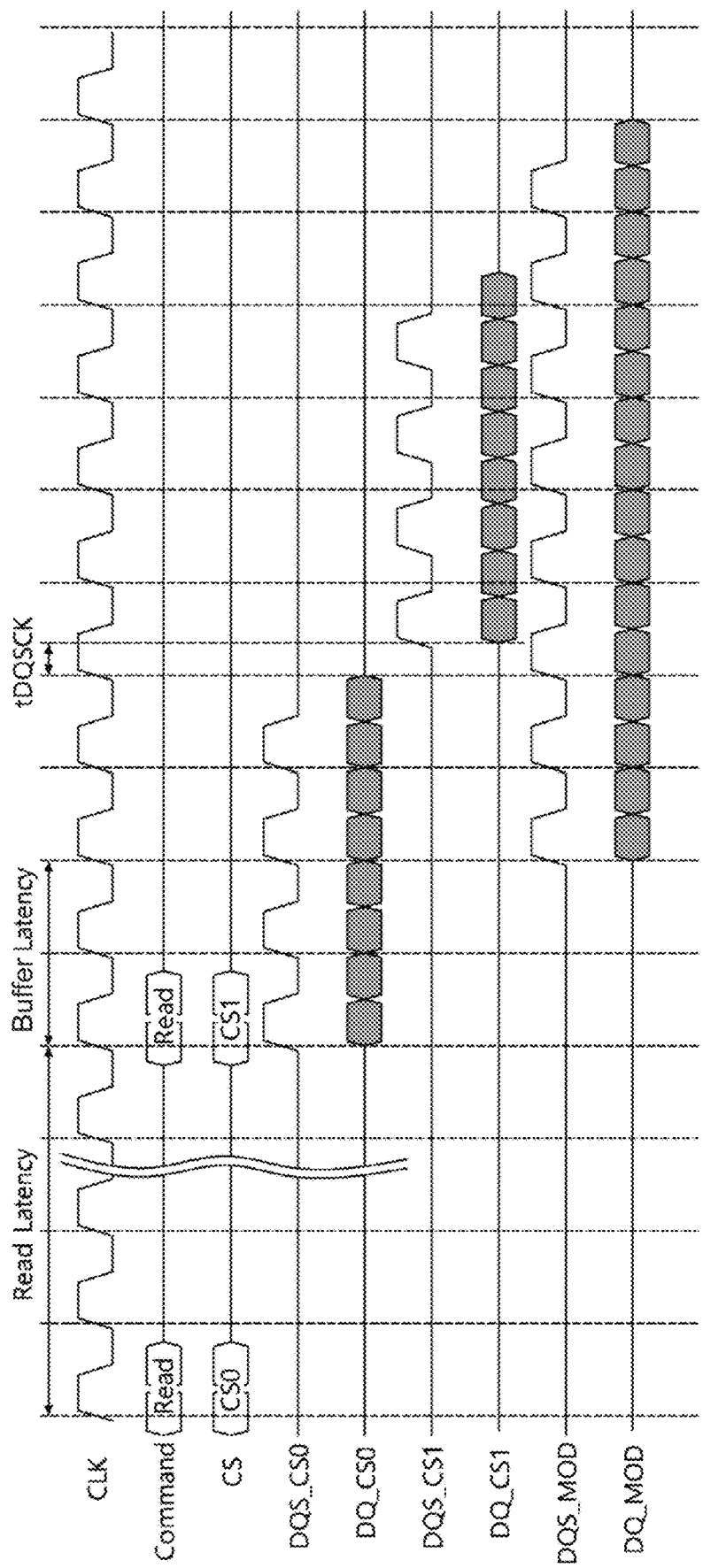
FIG. 8 is an illustration of a representation of an example of read operation timing diagram of a memory system according to an embodiment.
Figure 12:
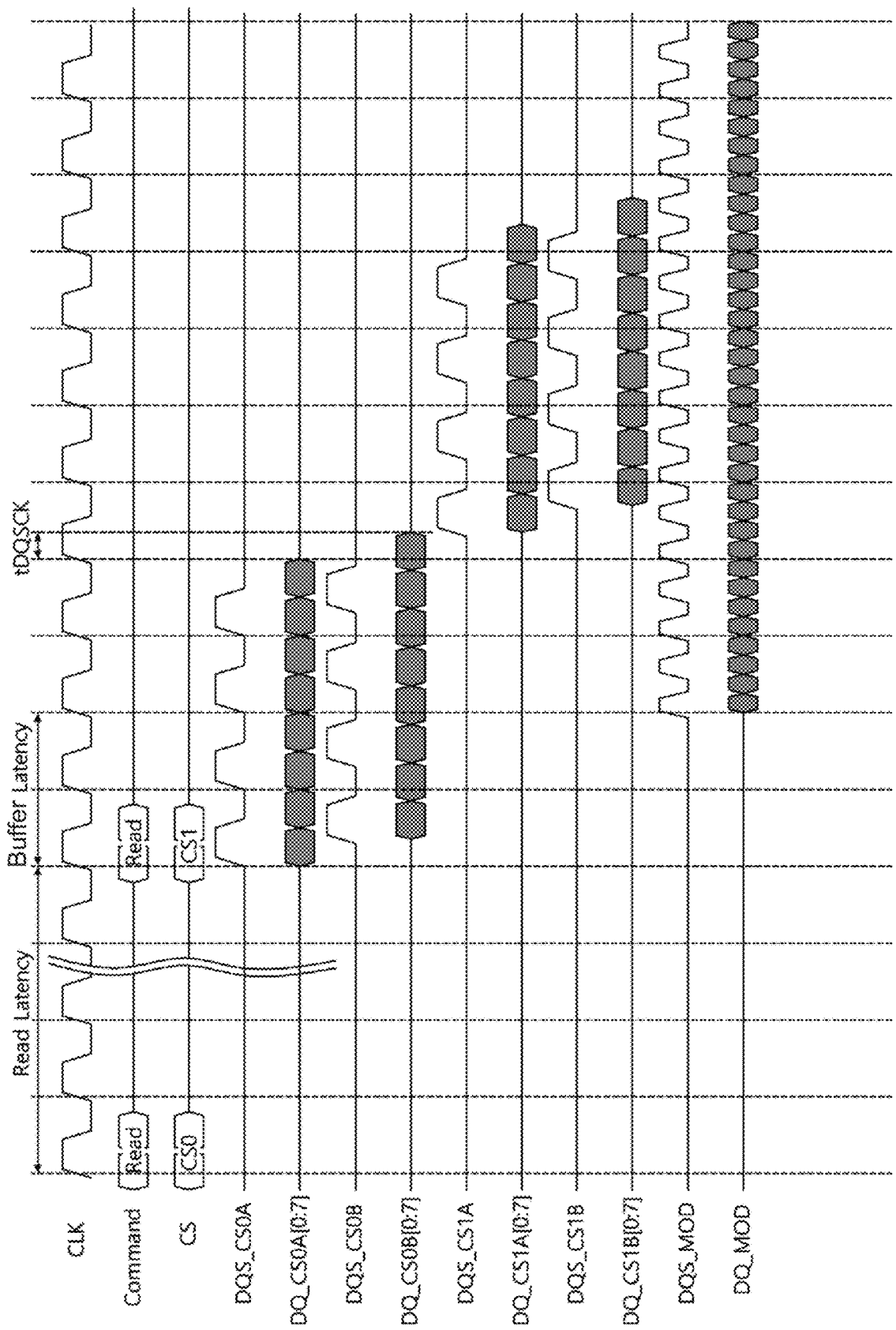
FIG. 12 is an illustration of a representation of an example of read operation timing diagram of a memory system according to an embodiment.

Since the channels perform the independent data output, the data output may be accomplished regardless of the timing margin tDQSCK differently from the data output in the rank structure of FIGS. 8 and 12 as described above.

After a buffer latency Buffer Latency from a point of time when the data DQ_CS0<0:31> is output, the buffer chip 502 may output the data DQ_CS0<0:31> as the data DQ_MOD<0:31> according to a strobe signal DQS_MOD_A.

After the buffer latency from a point of time when the data DQ_CS0<32:63> is output, the buffer chip 502 may output the data DQ_CS0<32:63> as the data DQ_MOD<32:63> according to a strobe signal DQS_MOD_B.

Figure 15:
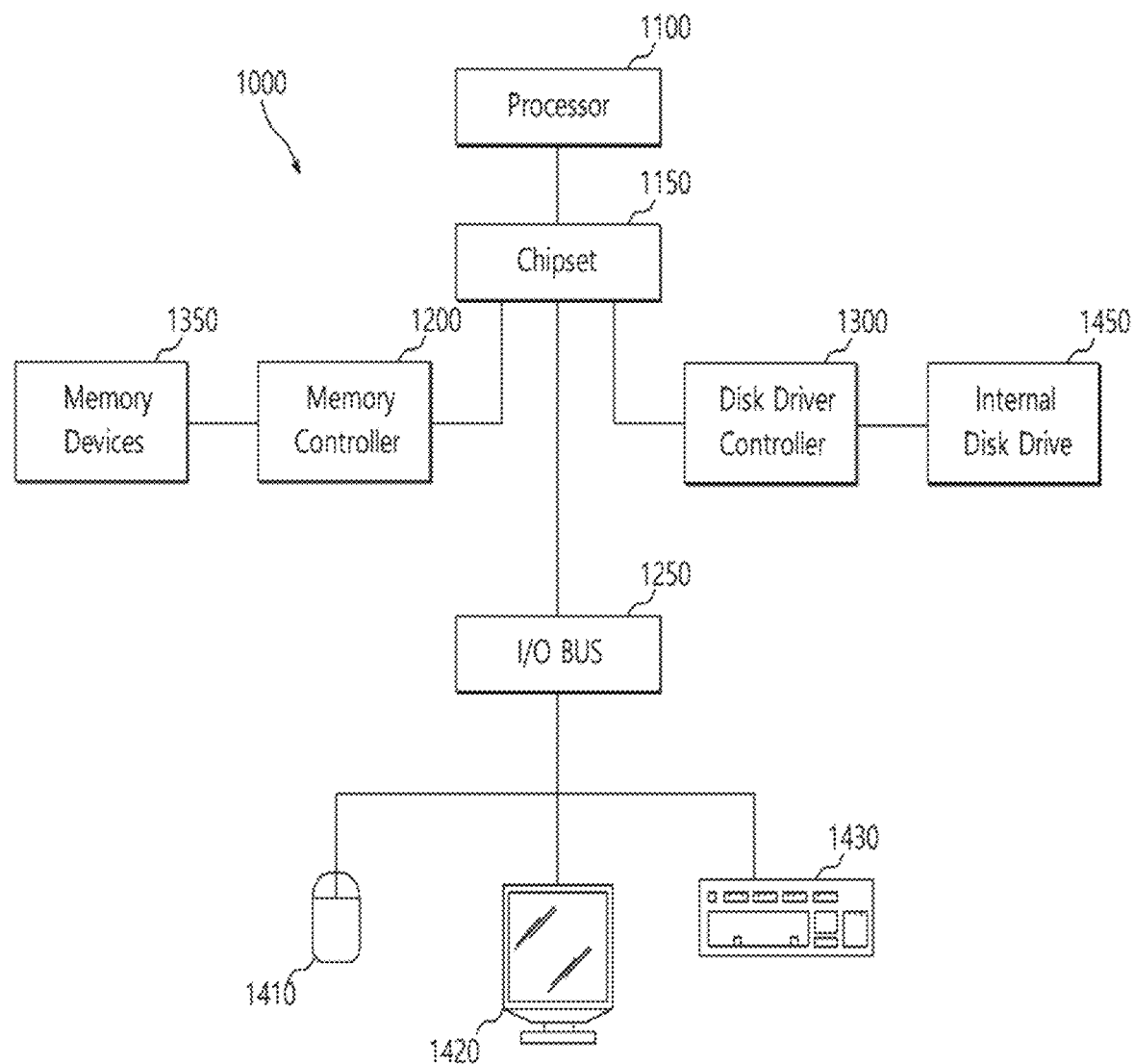
FIG. 15 illustrates a block diagram of an example of a representation of a system employing a memory module or memory system including the memory module with the various embodiments discussed above with relation to FIGS. 2-14.

The memory module or memory system including the memory module as discussed above (see FIGS. 2-14) are particular useful in the design of memory devices, processors, and computer systems. For example, referring to FIG. 15, a block diagram of a system employing a memory module or memory system including the memory module in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one memory module or memory system including the memory module as discussed above with reference to FIGS. 2-14. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one memory module or memory system including the memory module as discussed above with relation to FIGS. 2-14, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 15 is merely one example of a system 1000 employing a memory module or memory system including the memory module as discussed above with relation to FIGS. 2-14. In alternate embodiments, such as, for example but not limited to, cellular phones or digital cameras, the components may differ from the embodiments illustrated in FIG. 15.

The above embodiments are illustrative and not limitative. Various alternatives and equivalents are possible. The description is not limited by the embodiments described herein. Nor is the description limited to any specific type of semiconductor device. Other additions, subtractions, or modifications are obvious in view of the present disclosure and are intended to fall within the scope of the appended claims.

What is claimed is:

1. A memory system comprising:
 a controller; and
 a plurality of memory modules,
 wherein a data input and output of the plurality of memory modules is performed with a single channel manner according to an address signal provided from the controller in common,
 wherein each of the plurality of memory modules includes a buffer chip and a plurality of memory chips in a row direction coupled to the buffer chip,
 wherein memory chips in a column direction consisting of selected one by one in each memory module of the plurality of the memory modules constitutes a rank, and
 wherein all the buffer chips of the plurality of memory modules are directly coupled to the controller through independent input and output bus.

2. The memory system of claim 1, wherein data I/O is performed by selecting one or more memory chips from each of the plurality of memory modules according to a select signal provided from the controller.

3. The memory system of claim 1,
 wherein data I/O is performed by selecting one or more memory chips from each of the plurality of memory modules according to a select signal provided from the controller, and
 wherein the one or more memory chips selected from the plurality of memory modules are arranged on the same line.

4. The memory system of claim 1,
 wherein the plurality of memory chips are distributed and arranged on left and right sides of the buffer chip, and
 wherein an equal number of memory chips are located on the right side and the left side of the buffer chip.

5. The memory system of claim 1,
wherein the buffer chip includes:
a controller configured to generate control signals for controlling a data I/O operation between the plurality memory chips and the controller according to an address signal and a select signal;
a read multiplexing circuit configured to selectively output data output from the plurality of memory chips according to the control signals; and
a write multiplexing circuit configured to selectively transfer data input from the controller to the plurality of memory chips according to the control signals.

6. The memory system of claim 5,
wherein the read multiplexing circuit includes:
a plurality of latches configured to generate latch signals by latching the data output from the plurality of memory chips according to strobe signals and the control signals; and
a multiplexer configured to selectively output the latch signals according to the control signals.

7. The memory system of claim 5,
wherein the write multiplexing circuit includes:
a multiplexer configured to selectively output the data input from the controller according to the control signals; and
a plurality of variable delays configured to receive an output signal of the multiplexer according to the control signals and output delayed signals by delaying the received output signal by a preset time, and
wherein delay times of the plurality of variable delays are set according to distances between the buffer chip and the plurality of memory chips.

8. The memory system of claim 1,
wherein the buffer chip includes:
a controller configured to generate control signals for controlling a data I/O operation between the plurality of memory chips and the controller according to an address signal and a select signal;
a serializing and parallelizing (serializing/parallelizing) circuit configured to output data output from different two memory chips among the plurality of memory chips through serialization or output data input from the controller to the different two memory chips through parallelization;
a read multiplexing circuit configured to selectively output data output from the serializing/parallelizing circuit according to the control signals; and
a write multiplexing circuit configured to transfer the data input from the controller to the serializing/parallelizing circuit according to the control signals.

9. The memory system of claim 1, wherein the number of I/O lines in each of the plurality of memory modules is smaller than that of the controller.

10. A memory system comprising:
a controller; and
a plurality of memory modules,
wherein a data input and output of the plurality of memory modules is performed with a single channel manner according to an address signal provided from the controller in common,
wherein each of the plurality of memory modules includes a buffer chip and a plurality of memory chips in a row direction coupled to the buffer chip,
wherein memory chips in a column direction consisting of selected one by one in each memory module of the plurality of the memory modules constitutes a rank,
wherein all the buffer chips of the plurality of memory modules are directly coupled to the controller through independent input and output bus.

11. The memory system of claim 10,
wherein the plurality of memory chips are distributed and arranged on left and right sides of the buffer chip, and
wherein an equal number of memory chips are located on the right side and the left side of the buffer chip.

12. The memory system of claim 10,
wherein the buffer chip includes:
a controller configured to generate control signals for controlling a data I/O operation between the plurality memory chips and the controller according to an address signal and a select signal;
a read multiplexing circuit configured to selectively output data output from the plurality of memory chips according to the control signals; and
a write multiplexing circuit configured to selectively transfer data input from the controller to the plurality of memory chips according to the control signals.

13. The memory system of claim 12,
wherein the read multiplexing circuit includes:
a plurality of latches configured to generate latch signals by latching the data output from the plurality of memory chips according to strobe signals and the control signals; and
a multiplexer configured to selectively output the latch signals according to the control signals.

14. The memory system of claim 12,
wherein the write multiplexing circuit includes:
a multiplexer configured to selectively output the data input from the controller according to the control signals; and
a plurality of variable delays configured to receive an output signal of the multiplexer according to the control signals and output delayed signals by delaying the received output signal by a preset time, and
wherein delay times of the plurality of variable delays are set according to distances between the buffer chip and the plurality of memory chips.

15. The memory system of claim 10,
wherein the buffer chip includes:
a controller configured to generate control signals for controlling a data I/O operation between the plurality of memory chips and the controller according to an address signal and a select signal;
a serializing and parallelizing (serializing/parallelizing) circuit configured to output data output from different two memory chips among the plurality of memory chips through serialization or output the data input from the controller to the different two memory chips through parallelization;
a read multiplexing circuit configured to selectively output data output from the serializing/parallelizing circuit according to the control signals; and
a write multiplexing circuit configured to transfer the data input from the controller to the serializing/parallelizing circuit according to the control signals.

16. The memory system of claim 10, wherein the number of I/O lines in each of the plurality of memory modules is smaller than that of the controller.

\* \* \* \* \*